(12) United States Patent  
Wang (10) Patent No.: US 7,535,371 B2
(45) Date of Patent: May 19, 2009

(54) GROUND FAULT CIRCUIT INTERRUPTER WITH END-OF-LIFE PROTECTION

(75) Inventor: Ping Wang, Chuzhou (CN)

(73) Assignee: Wenzhou Sansheng Electrical Co., Ltd., Zhejiang (CN)

( * ) Notice: Subject to any disclaimer, the term of this patent is extended or adjusted under 35 U.S.C. 154(b) by 314 days.

(21) Appl. No.: 11/449,991

(22) Filed: Jun. 9, 2006

(65) Prior Publication Data
US 2007/0285267 A1    Dec. 13, 2007

(51) Int. Cl.
*G08B 21/00*    (2006.01)
(52) U.S. Cl. ............... 340/638; 340/635; 340/641; 340/644; 340/650; 340/652; 361/42; 337/241
(58) Field of Classification Search ........... 340/638, 340/639, 635, 641, 644, 645, 649, 650, 652, 340/654, 691.1; 361/42; 337/241, 242
See application file for complete search history.

(56) References Cited

U.S. PATENT DOCUMENTS

| | | | | |
|---|---|---|---|---|
| 5,343,192 A | * | 8/1994 | Yenisey | 340/639 |
| 5,986,557 A | * | 11/1999 | Clarke | 340/638 |
| 6,697,238 B2 | | 2/2004 | Bonilla et al. | 361/42 |
| 7,315,437 B2 | * | 1/2008 | Bonilla et al. | 361/42 |
| 7,336,457 B2 | * | 2/2008 | Liscinsky, III | 361/42 |
| 2004/0080879 A1 | | 4/2004 | Radosavljevic et al. | 361/42 |
| 2004/0264077 A1 | * | 12/2004 | Radosavljevic et al. | 361/42 |
| 2006/0018059 A1 | | 1/2006 | Elms et al. | 361/42 |
| 2006/0279886 A1 | * | 12/2006 | Huang et al. | 361/42 |

* cited by examiner

*Primary Examiner*—Toan N Pham
(74) *Attorney, Agent, or Firm*—Hogan & Hartson LLP (57) ABSTRACT

A circuit interrupter with end-of-life protection has four components: 1) a control circuit to activate an electromagnetic unit upon detecting a predetermined condition; 2) a fuse coupled between the control circuit and the power supply; 3) an end life sensing circuit coupled to the control circuit; and 4) an end life indicating circuit coupled to the end life sensing circuit and the power supply. The end life sensing circuit includes a light emitting device and a light sensitive device controlled by the light emitting device. The end life indicating circuit includes a visual indicator to indicate that the circuit interrupter reaches the end of its life. Another circuit interrupter with end-of-life protection has three components: 1) a control circuit to activate an electromagnetic unit upon detecting a predetermined condition; 2) a fuse coupled between the control circuit and the power supply; and 3) an end life sensing and indicating circuit coupled to the control circuit. The end life sensing and indicating circuit includes a light emitting device which is turned off to indicate that the circuit interrupter reached the end of its life.

35 Claims, 4 Drawing Sheets

GROUND FAULT CIRCUIT INTERRUPTER WITH END-OF-LIFE PROTECTION

BACKGROUND

1. Field of the Invention

The present invention relates to a ground fault circuit interrupter. More specifically, the present invention relates to a ground fault circuit interrupter with end-of-life protection.

2. Description of the Related Art

With the increasing use of household electrical appliances, people demand that receptacles installed in their houses be capable of protecting them from serious injury when accidentally touched or other ground fault conditions occur. Thus, ground fault circuit interrupters ("GFCI devices") are designed to break the electrical continuity upon detecting a ground fault condition occurring at an alternating current ("AC") load.

Many electrical wiring devices including receptacles have a line side that is connectable to an electrical power supply, and a load side that is connectable to one or more loads and at least one conductive path between the line side and load side. When a person accidentally comes in contact with the line side of the AC load and an earth ground at the same time, a serious injury may occur because the human body forms another conductive path for the electrical current to flow through. There is a strong desire for electrical wiring devices that can break electric power supply to various loads such as household appliances and consumer electronic products when a ground fault condition occurs.

The GFCI devices can detect a ground fault condition and break the electric power supply by employing a sensing transformer to detect an imbalance between the currents flowing in the phase (also known as "hot") and neutral conductive paths of the power supply. A ground fault condition happens when the current is diverted to the ground through another path such as a human body, that results in an imbalance between the currents flowing in the phase and neutral conductors. Upon detection of a ground fault condition, a breaker within the GFCI devices is immediately tripped to interrupt the electrical continuity and removes all power supply to the loads.

However, a GFCI device may reach the end of its life and cannot function properly to break the power supply after detecting a ground fault condition. Consumers are endangered if they are not aware that the GFCI device has reached the end of its life and continue to use it.

SUMMARY OF THE PREFERRED EMBODIMENTS

A circuit interrupter with end-of-life protection has four components: 1) a control circuit to activate an electromagnetic unit upon detecting a predetermined condition; 2) a fuse coupled between the control circuit and the power supply; 3) an end life sensing circuit coupled to the control circuit; and 4) an end life indicating circuit coupled to the end life sensing circuit and the power supply. The end life sensing circuit includes a light emitting device and a light sensitive device controlled by the light emitting device. The end life indicating circuit includes a visual indicator to indicate that the circuit interrupter reaches the end of its life.

Another circuit interrupter with end-of-life protection has three components: 1) a control circuit to activate an electromagnetic unit upon detecting a predetermined condition; 2) a fuse coupled between the control circuit and the power supply; and 3) an end life sensing and indicating circuit coupled to the control circuit. The end life sensing and indicating circuit includes a light emitting device which is turned off to indicate that the circuit interrupter reaches the end of its life.

BRIEF DESCRIPTION OF THE DRAWINGS

A more complete understanding of the present invention can be obtained by reference to the detailed description in conjunction with the accompanying drawings, which form part of the disclosure. These drawings depict only a typical embodiment of the invention and are not intended to limit its scope.

DETAILED DESCRIPTION OF THE PREFERRED EMBODIMENTS

To protect consumers, a circuit interrupter can indicate by visual means that the circuit interrupter reaches the end of its life. Alternatively, a circuit interrupter is tripped to disconnect a conduction path when the circuit interrupter reaches the end of its life. A circuit interrupter reaches the end of its life when some components are broken so that the circuit interrupter can not function properly to disconnect a conduction path after detecting a predetermined condition such as a ground fault. The indication of visual means and/or the trip condition can warn consumers to replace the circuit interrupter or not to use it.

Figure 1:
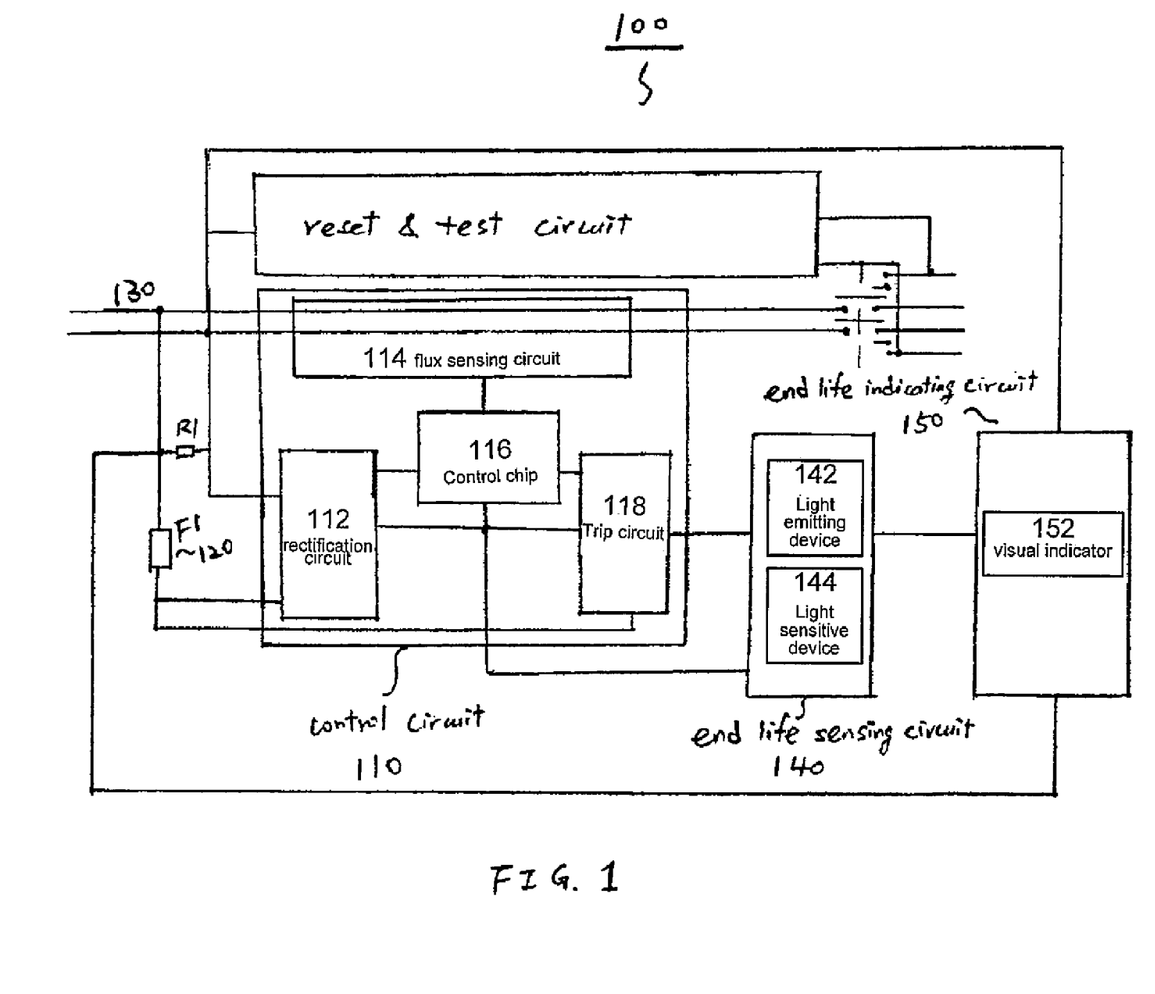
FIG. 1 is a block diagram of an exemplary embodiment of a circuit interrupter with end-of-life protection.

As shown in FIG. 1, a circuit interrupter 100 with end-of-life protection has four components: 1) a control circuit 110 to activate an electromagnetic unit upon detecting a predetermined condition; 2) a fuse 120 (F1) coupled between the control circuit 110 and the power supply 130; 3) an end life sensing circuit 140 coupled to the control circuit 110; and 4) an end life indicating circuit 150 coupled to the end life sensing circuit 140 and the power supply 130. The end life sensing circuit 140 includes a light emitting device 142 and a light sensitive device 144 controlled by the light emitting device 142. The light emitting device 142 can be a light emitting diode. The light sensitive device 144 can be a light sensitive resistor or a phototransistor. The end life indicating circuit 150 has a visual indicator 152 to indicate that the circuit interrupter 100 reaches the end of its life. The visual indicator 152 can be a light emitting diode. In addition, the circuit interrupter 100 may further include a reset and test circuit as well as a voltage dependent resistor (R1).

The control circuit 110 includes a rectification circuit 112, a flux sensing circuit 114, a control chip 116 and a trip circuit 118 having the electromagnetic unit. The rectification circuit 112 supplies a direct current to the control chip 116, the trip circuit 118 and the end life sensing circuit 140. Upon detecting a predetermined condition, the flux sensing circuit 114 provides a signal to the control chip 116. The control chip 116 then provides a signal to the trip circuit 118 to activate the electromagnetic unit. In one embodiment, the control chip 116 is an integrated circuit with a model number RV4145 manufactured by Fairchild Semiconductor. People with ordinary skill in the art understand that other chips and circuits such as LM1851, RV4141, KA2807 and KA2145 also can be used to implement the control chip 116.

Figure 2:
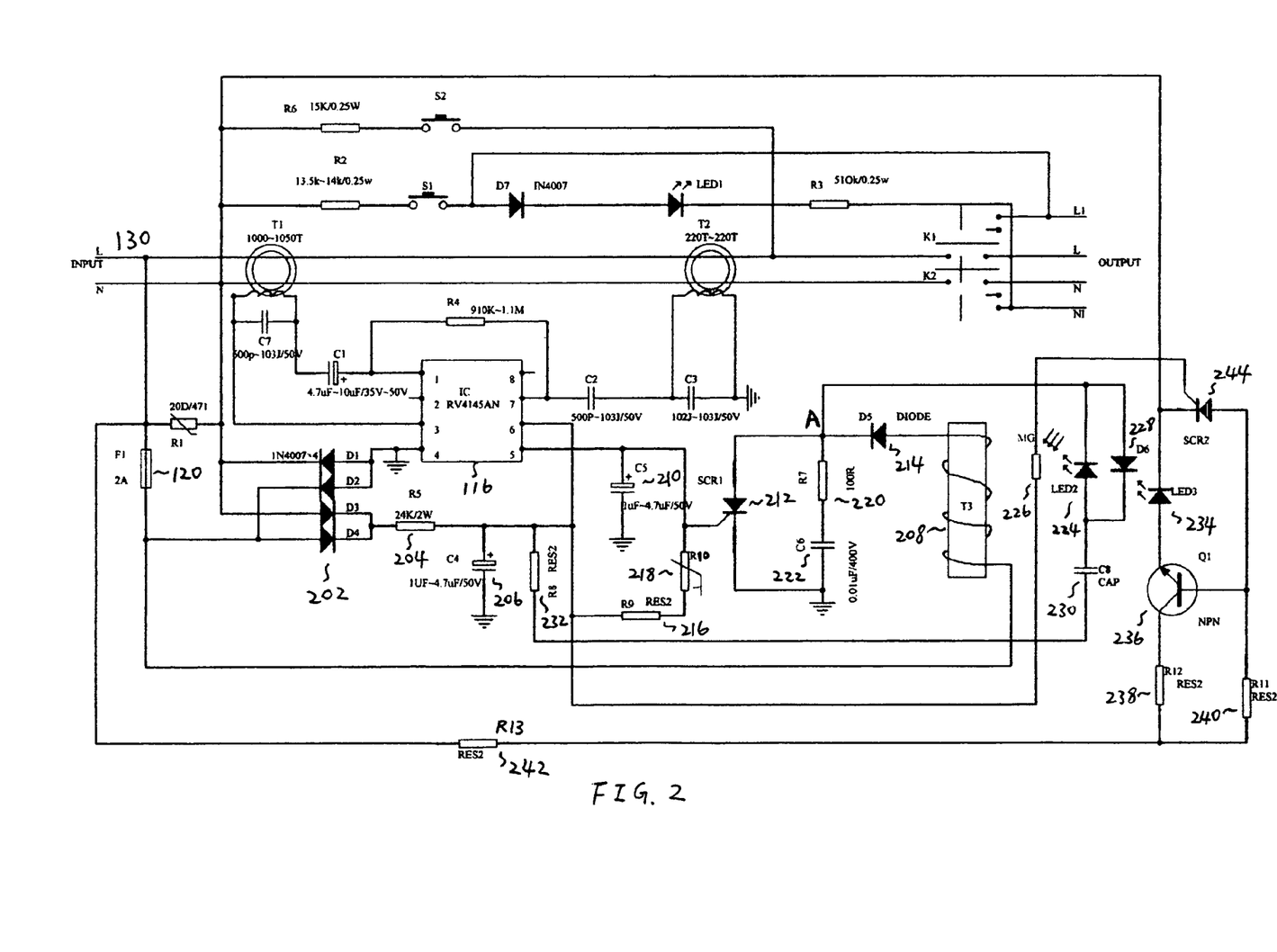
FIG. 2 is a circuit schematic of an exemplary embodiment of the circuit interrupter shown in FIG. 1.

FIG. 2 demonstrates an embodiment of the circuit interrupter 100. The rectification circuit 112 includes a bridge rectifier 202 (D1-D4), a first resistor 204 (R5) and a first capacitor 206 (C4). The bridge rectifier 202 having diodes D1-D4 is coupled to the power supply 130 through the fuse 120 (F1) to receive an alternating current and to output a direct current. One output end of the bridge rectifier 202, the anodes of diodes D1 and D2, is connected to the ground and the control chip 116. The other output end of the bridge rectifier 202, the cathodes of diodes D3 and D4, is connected to the first end of the first resistor 204 (R5). The second end of the first resistor 204 (R5) is connected to a positive end of the first capacitor 206 (C4), the control chip 116, the trip circuit 118 and the end life sensing circuit 140. The negative end of the first capacitor (C4) is connected to the ground. In one embodiment, the first resistor 204 (R5) has a resistance at about 10-50 k Ohms. The first capacitor 206 (C4) has a capacitance at about 1-10 μF.

The trip circuit 118 includes an electromagnetic unit 208 (T3), a second capacitor 210 (C5), a first silicon controlled rectifier 212 (SCR1) to function as a trip switch, a first diode 214 (D5), a second resistor 216 (R9), a temperature dependent resistor 218 (R10), a third resistor 220 (R7), and a third capacitor 222 (C6). People with ordinary skill in the art would appreciate ways other than the first silicon controlled rectifier 212 (SCR1) to implement the function of a trip switch, such as a transistor. In one embodiment, the second capacitor 210 (C5) has a capacitance at about 1-10 μF. The third capacitor 222 (C6) has a capacitance at about 0.001-0.1 μF/300-100V. The second resistor 216 (R9) has a resistance at about 100-250 k Ohms. The third resistor 220 (R7) has a resistance at about 10-500 Ohms. The temperature dependent resistor 218 (R10) has a positive temperature coefficient with a resistance at about 0.1-100 k Ohms. The first silicon controlled rectifier 212 (SCR1) has a trigger current at about 10-200 μA.

In the trip circuit 118, the first end of the electromagnetic unit 208 (T3) is connected to the power supply 130 through the fuse 120 (F1). The second end of the electromagnetic unit 208 (T3) is connected to an anode of the first diode 214 (D5). The cathode of the first diode 214 (D5) is connected to an anode of the first silicon controlled rectifier 212 (SCR1), the first end of the third resistor 220 (R7) and the end life sensing circuit 140. The second end of the third resistor 220 (R7) is connected to the first end of the third capacitor 222 (C6). The cathode of the first silicon controlled rectifier 212 (SCR1) and the second end of the third capacitor 222 (C6) are connected to the ground. The gate of the first silicon controlled rectifier 212 (SCR1) is connected to the positive end of the second capacitor 210 (C5), the control chip 116 and the first end of the temperature dependent resistor 218 (R10). The negative end of the second capacitor 210 (C5) is connected to the ground. The second end of the temperature dependent resistor 218 (R10) is connected to the first end of the second resistor 216 (R9). The second end of the second resistor 216 (R9) is connected to the rectification circuit 112 and the end life sensing circuit 140.

The end life sensing circuit 140 includes a first light emitting diode 224 (LED2) to function as the light emitting device 142, a light sensitive resistor 226 (MG) to function as the light sensitive device 144, a second diode 228 (D6), a fourth capacitor 230 (C8) and the fourth resistor 232 (R8). The resistance of the light sensitive resistor 226 (MG) is controlled by the light emitted from the first light emitting diode 224 (LED2). In one embodiment, the fourth capacitor 230 (C8) has a capacitance at about 0.001-10 μF. The fourth resistor 232 (R8) has a resistance at about 10-60 k Ohms.

In the end life sensing circuit 140, the anode of the first light emitting diode 224 (LED2) is connected to the cathode of the second diode 228 (D6) and the first end of the fourth capacitor 230 (C8). The second end of the fourth capacitor 230 (C8) is connected to the first end of the fourth resistor 232 (R8). The second end of the fourth resistor 232 (R8) is connected to the rectification circuit 112 and the trip circuit 118. The cathode of the first light emitting diode 224 (LED2) is connected to the anode of the second diode 228 (D6) and node A. The first end of the light sensitive resistor 226 (MG) is connected to the rectification circuit 112 and the trip circuit 118. The second end of the light sensitive resistor 226 (MG) is connected to the end life indicating circuit 150. When some components of the circuit interrupter 100 are broken which may also blow the fuse 120, the first light emitting diode 224 (LED2) is turned off. As a result, the resistance of the light sensitive resistor 226 (MG) increases to turn on the visual indicator 152 to warn customers about the failure of the circuit interrupter 100.

The end life indicating circuit 150 includes a second light emitting diode 234 (LED3) to function as a visual indicator 152, a transistor 236 (Q1), a fifth resistor 238 (R12), a sixth resistor 240 (R11), a seventh resistor 242 (R13) and a second silicon controlled rectifier 244 (SCR2). In one embodiment, the fifth resistor 238 (R12) has a resistance at about 1-20 k Ohms; the sixth resistor 240 (R11) has a resistance at about 10-60 k Ohms; and the seventh resistor 242 (R13) has a resistance at about 50-600 k Ohms. The second silicon controlled rectifier 244 (SCR2) has a trigger current at about 10-200 μA. The transistor 236 (Q1) is an NPN transistor.

The first ends of the fifth resistor 238 (R12) and the sixth resistor 240 (R11) are connected to a line side of the power supply 130 through the seventh resistor 242 (R13). The second end of the fifth resistor 238 (R12) is connected to the collector of the NPN transistor 236 (Q1). The second end of the sixth resistor 240 (R11) is connected to the base of the NPN transistor 236 (Q1) and the anode of the second silicon controlled rectifier 244 (SCR2). The emitter of the NPN transistor 236 (Q1) is connected to the anode of the second light emitting diode 234 (LED3). The cathode of the second light emitting diode 234 (LED3) is connected to the cathode of the second silicon controlled rectifier 244 (SCR2) and a neutral side of the power supply 130. The gate of the second silicon controlled rectifier 244 (SCR2) is connected to the light sensitive resistor 226 (MG).

When the circuit interrupter 100 functions properly, the first light emitting diode 224 (LED2) is turned on and the second light emitting diode 234 (LED3) is turned off. The rectification circuit 112 provides a direct current at about 27V to the control chip 116, the trip circuit 118 and the end life sensing circuit 140. The bridge rectifier 202 (D1-D4) converts an alternating current (AC) from the power supply 130 into a direct current (DC). The first resistor 204 (R5) reduces the voltage of the direct current to about 27V. The first capacitor 206 (C4) smoothens the wave form. The direct current from the rectification circuit 112 is provided through the second resistor 216 (R9) and the temperature dependent resistor 218 (R10) to the gate of the first silicon controlled rectifier 212 (SCR1). As a result, the first silicon controlled rectifier 212 (SCR1) is slightly turned on so that a small current can pass from the anode to the cathode of the first silicon controlled rectifier 212 (SCR1). Accordingly the first light emitting diode 224 (LED2) is boosted to emit lights which shed on the light sensitive resistor 226 (MG) to reduce its resistance.

When the resistance of the light sensitive resistor 226 (MG) is low, the direct current from the rectification circuit 112 is provided through the light sensitive resistor 226 (MG) to the gate of the second silicon controlled rectifier 244 (SCR2). As a result, the second silicon controlled rectifier 244 (SCR2) is turned on so that a current flows through the sixth resistor 240 (R11) and the second silicon controlled rectifier 244 (SCR2), rather than flowing through the second light emitting diode 234 (LED3). Thus, the second light emitting diode 234 (LED3) is turned off.

If the circuit interrupter 100 functions properly, it can protect people from serious injury when they accidentally touch the electric power to cause ground fault conditions. The circuit interrupter 100 is first reset to establish the conduction path so that electric power is provided to load ends of the circuit interrupter 100. When a ground fault condition occurs, the flux sensing circuit 114 senses an imbalance of the flux and sends a signal to the control chip 116. The control chip 116 then outputs a signal to the trip circuit 118 to turn on the first silicon controlled rectifier 212 (SCR1) so that the electromagnetic unit 208 (T3) is activated to disconnect the conduction path of the circuit interrupter 100. The circuit interrupter 100 remains in a trip condition until the reset button is pressed to re-establish the electric connection.

When the circuit interrupter 100 reaches the end of its life, the second light emitting diode 234 (LED3) is turned on and/or the circuit interrupter 100 is tripped to warn consumers that the circuit interrupter 100 can no longer protect people from electric shock. The circuit interrupter 100 reaches the end of its life if some components are broken so that the circuit interrupter 100 does not function properly to disconnect the conduction path after detecting a predetermined condition. These components may include the first silicon controlled rectifier 212 (SCR1), the bridge rectifier 202 (D1-D4), the first resistor 204 (R5) the first capacitor 206 (C4) and the control chip 116.

If the first silicon controlled rectifier 212 (SCR1) is broken so that the anode end and the cathode end of first silicon controlled rectifier 212 (SCR1) are short momentarily at the time the circuit interrupter 100 is in a reset condition, the electromagnetic unit 208 (T3) is activated to disconnect the conduction path of the circuit interrupter 100. As a result, the circuit interrupter 100 is in a trip condition and the load end of the circuit interrupter 100 has no electric output. However, the second light emitting diode 234 (LED3) remains off.

If the first silicon controlled rectifier 212 (SCR1) is continuously short for a longer time such as over 5 seconds at the time the circuit interrupter 100 is in a reset condition, the fuse 120 is blown. No direct current is provided to the control chip 116, the trip circuit 118 and the end life sensing circuit 140. The circuit interrupter 100 can not be reset again. Besides, the first light emitting diode 224 (LED2) is turned off and no current is provided through the light sensitive resistor 226 (MG) to the gate of the second silicon controlled rectifier 244 (SCR2). The second silicon controlled rectifier 244 (SCR2) is turned off and the NPN transistor 236 (Q1) is tuned on. The second light emitting diode 234 (LED3) is then turned on to indicate that the circuit interrupter has reached the end of its life and needs to be replaced.

If the first silicon controlled rectifier 212 (SCR1) is broken so that the anode end and the cathode end of the first silicon controlled rectifier 212 (SCR1) are continuously short for a longer time such as over 5 seconds at the time the circuit interrupter 100 is in a trip condition, the fuse 120 is blown. The circuit interrupter 100 is unable to be reset and needs to be replaced. With the above-mentioned reasons, the first light emitting diode 224 (LED2) is turned off and the second light emitting diode 234 (LED3) is turned on to indicate that the circuit interrupter has reached the end of its life.

If the first silicon controlled rectifier 212 (SCR1) is broken and forms an open circuit among its anode, cathode and gate at the time the circuit interrupter 100 is in a reset condition, the first silicon controlled rectifier 212 (SCR1) cannot be turned on to activate the electromagnetic unit 208 (T3). Thus, the circuit interrupter 100 remains at a reset condition. However, the first light emitting diode 224 (LED2) is turned off and the resistance of the light sensitive resistor 226 (MG) is increased. As a result, the current provided to the gate of the second silicon controlled rectifier 244 (SCR2) is decreased to turn off the second silicon controlled rectifier 244 (SCR2). The second light emitting diode 234 (LED3) is then turned on to indicate that the circuit interrupter 100 has reached the end of its life and needs to be replaced.

If the first silicon controlled rectifier 212 (SCR1) is broken and forms an open circuit among its anode, cathode and gate at the time the circuit interrupter 100 is in a trip condition, the first silicon controlled rectifier 212 (SCR1) cannot be turned on to activate the electromagnetic unit 208 (T3). Thus, the circuit interrupter 100 cannot be reset. Besides, the first light emitting diode 224 (LED2) is turned off and the resistance of the light sensitive resistor 226 (MG) is increased. As a result, the current provided to the gate of the second silicon controlled rectifier 244 (SCR2) is decreased to turn off the second silicon controlled rectifier 244 (SCR2). The second light emitting diode 234 (LED3) is then turned on to indicate that the circuit interrupter 100 has reached the end of its life and needs to be replaced.

If any of the following situations occurs: 1) one or more diodes of the bridge rectifier 202 (D1-D4) are short; 2) the first resistor 204 (R5) is short; 3) the first resistor 204 (R5) forms an open circuit; 4) the first capacitor 206 (C4) is short; or 5) the control chip 116 is short, the control chip 116, the trip circuit 118 and the end life sensing circuit 140 lose power supply and the control circuit 110 can not operate any more. If the circuit interrupter 100 is in a reset condition when the situation occurs, it stays in a reset condition. If the circuit interrupter 100 is in a trip condition when the situation occurs, it stays in a trip condition and can not be reset. Besides, the first light emitting diode 224 (LED2) is turned off and the resistance of the light sensitive resistor 226 (MG) is increased. No current is provided through the light sensitive resistor 226 (MG) to the gate of the second silicon controlled rectifier 244 (SCR2). The second silicon controlled rectifier 244 (SCR2) is turned off and the NPN transistor 236 (Q1) is tuned on. The second light emitting diode 234 (LED3) is then turned on to indicate that the circuit interrupter has reached the end of its life and needs to be replaced. In the embodiment where the integrated circuit RV4145AN is used to implement the control chip 116, the control chip 116 is short when its pin 4 and pin 6 are short.

Figure 3:
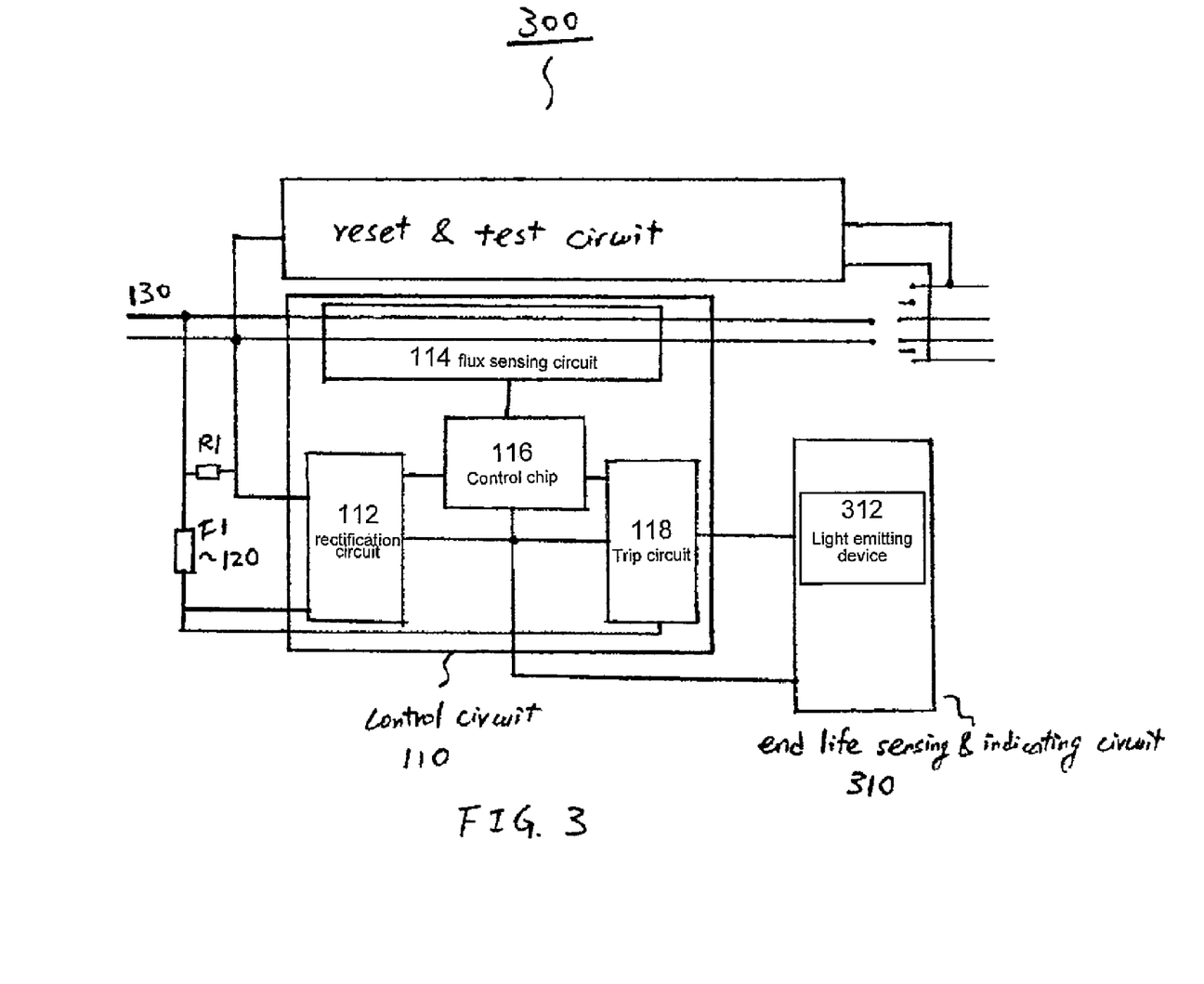
FIG. 3 is a block diagram of another exemplary embodiment of a circuit interrupter with end-of-life protection.

As shown in FIG. 3, another circuit interrupter 300 with end-of-life protection has three components: 1) a control circuit 110 to activate an electromagnetic unit upon detecting a predetermined condition; 2) a fuse 120 (F1) coupled between the control circuit 110 and the power supply 130; 3) an end life sensing and indicating circuit 310 coupled to the control circuit 110. The end life sensing and indicating circuit 310 includes a light emitting device 312 which is turned off to indicate a failure of the control circuit 110. In addition, the circuit interrupter 300 may further include a reset and test circuit as well as a voltage dependent resistor (R1). Because the circuit interrupter 300 has the same control circuit 110 and fuse 120 (F1) as those in the circuit interrupter 100, the same numbering indicia in FIGS. 1 and 2 are used to describe the circuit interrupter 300.

Figure 4:
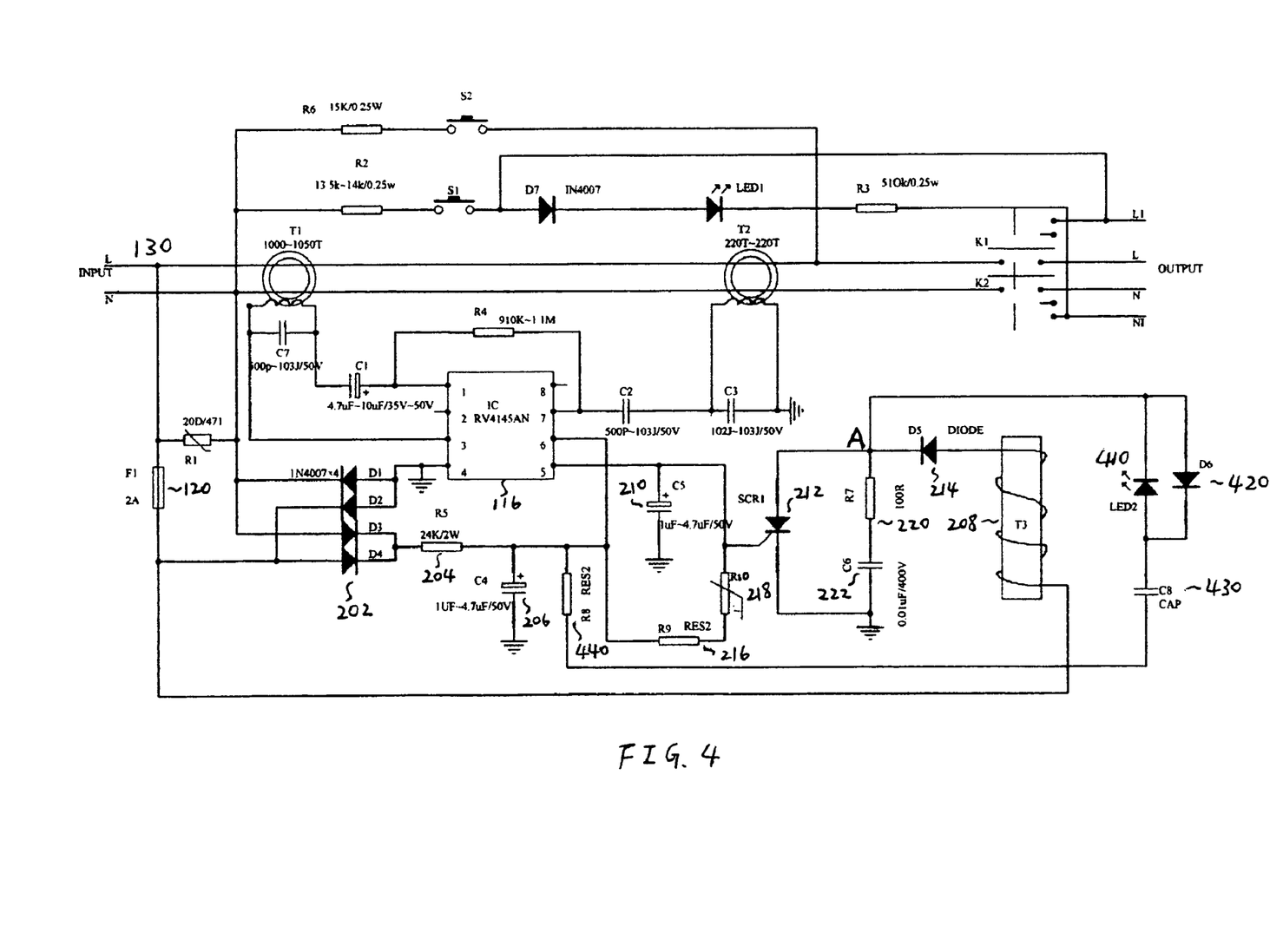
FIG. 4 is a circuit schematic of an exemplary embodiment of the circuit interrupter shown in FIG. 3.

FIG. 4 demonstrates an embodiment of the circuit interrupter 300. The end life sensing and indicating circuit 310 includes a first light emitting diode 410 (LED2), a second diode 420 (D6), a fourth capacitor 430 (C8) and a fourth resistor 440 (R8). In one embodiment, the fourth capacitor 430 (C8) has a capacitance at about 0.001-10 µF. The fourth resistor 440 (R8) has a resistance at about 10-60 k Ohms.

In the end life sensing and indicating circuit 310, the anode of the first light emitting diode 410 (LED2) is connected to the cathode of the second diode 420 (D6) and the first end of the fourth capacitor 430 (C8). The second end of the fourth capacitor 430 (C8) is connected to the first end of the fourth resistor 440 (R8). The second end of the fourth resistor 440 (R8) is connected to the rectification circuit 112 and the trip circuit 118. The cathode of the first light emitting diode 410 (LED2) is connected to the anode of the second diode 420 (D6) and node A. When the circuit interrupter 300 functions properly, the first light emitting diode 410 (LED2) is turned on. When the circuit interrupter 300 reaches the end of its life because some components of the circuit interrupter 300 are broken, the first light emitting diode 410 (LED2) is turned off to indicate a failure of the control circuit 110. Alternatively, the circuit interrupter 300 is tripped to disconnect the conduction path so that the load ends have no electric power. Consumers should replace the circuit interrupter or stop to use it. In one embodiment, the first light emitting diode 410 (LED2) is a green color light emitting diode.

If the first silicon controlled rectifier 212 (SCR1) is broken so that the anode end and the cathode end of first silicon controlled rectifier 212 (SCR1) are short momentarily at the time the circuit interrupter 300 is in a reset condition, the electromagnetic unit 208 (T3) is activated to disconnect the conduction path of the circuit interrupter 300. As a result, the circuit interrupter 300 is in a trip condition and the load end of the circuit interrupter 300 has no electric output. However, the first light emitting diode 410 (LED2) remains on.

If the first silicon controlled rectifier 212 (SCR1) is continuously short for a longer time such as over 5 seconds at the time the circuit interrupter 100 is in a reset condition, the fuse 120 (F1) is blown. No direct current is provided to the control chip 116, the trip circuit 118 and the end life sensing and indicating circuit 310. The circuit interrupter 300 can not be reset again. The first light emitting diode 410 (LED2) is also turned off to indicate that the circuit interrupter 300 has reached the end of its life and needs to be replaced.

If the first silicon controlled rectifier 212 (SCR1) is broken so that the anode end and the cathode end of first silicon controlled rectifier 212 (SCR1) are continuously short for a longer time such as over 5 seconds at the time the circuit interrupter 300 is in a trip condition, the fuse 120 (F1) is blown. The circuit interrupter 300 is unable to be reset and needs to be replaced. The first light emitting diode 410 (LED2) is also turned off to indicate that the circuit interrupter 300 has reached the end of its life and needs to be replaced.

If the first silicon controlled rectifier 212 (SCR1) is broken and forms an open circuit among its anode, cathode and gate at the time the circuit interrupter 300 is in a reset condition, the first silicon controlled rectifier 212 (SCR1) can not be turned on to activate the electromagnetic unit 208 (T3). Thus, the circuit interrupter 300 remains in a reset condition. However, the first light emitting diode 410 (LED2) is turned off to indicate that the circuit interrupter 300 has reached the end of its life and needs to be replaced.

If the first silicon controlled rectifier 212 (SCR1) is broken and forms an open circuit among its anode, cathode and gate at the time the circuit interrupter 300 is in a trip condition, the first silicon controlled rectifier 212 (SCR1) can not be turned on to activate the electromagnetic unit 208 (T3). Thus, the circuit interrupter 300 can not be reset. Besides, the first light emitting diode 410 (LED2) is turned off to indicate that the circuit interrupter 300 has reached the end of its life and needs to be replaced.

If any of the following situations occurs: 1) one or more diodes of the bridge rectifier 202 (D1-D4) are short; 2) the first resistor 204 (R5) is short; 3) the first resistor 204 (R5) forms an open circuit; 4) the first capacitor 206 (C4) is short; or 5) the control chip 116 is short, the control chip 116, the trip circuit 118 and the end life sensing and indicating circuit 310 lose power supply. If the circuit interrupter 300 is at a reset condition when the situation occurs, it remains in a reset condition. If the circuit interrupter 300 is in a trip condition when the situation occurs, it remains in a trip condition and can not be reset. Besides, the first light emitting diode 410 (LED2) is turned off to indicate that the circuit interrupter 300 has reached the end of its life and needs to be replaced. In the embodiment where the integrated circuit RV4145AN is used to implement the control chip 116, the control chip 116 is short when its pin 4 and pin 6 are short.

Although the invention has been described in terms of exemplary embodiments, it is not limited thereto. The described embodiments are to be considered in all respects only as illustrative and not as restrictive. People with ordinary skill in the art can appreciate using other electric components with similar electric characteristics. The term "connected to" can mean directly connected to or indirectly connected to. The present invention may be embodied in other specific forms without departing from its essential characteristics. The scope of the invention, therefore, is indicated by the appended claims rather than by the foregoing description. All changes, which come within the meaning and range of the equivalents of the claims, are to be embraced within their scope.

I claim:

1. A circuit interrupter comprising:
   a control circuit to activate an electromagnetic unit upon detecting a predetermined condition;
   a fuse coupled between the control circuit and a power supply;
   an end life sensing circuit coupled to the control circuit, the end life sensing circuit including a light emitting device and a light sensitive device controlled by the light emitting device; and
   an end life indicating circuit coupled to the end life sensing circuit and the power supply, the end life indicating circuit including a visual indicator to indicate a failure of the circuit interrupter.

2. The circuit interrupter of claim 1, wherein
   the light emitting device is a first light emitting diode and the visual indicator is the second light emitting diode.

3. The circuit interrupter of claim 1, wherein the visual indicator is a red color light emitting diode.

4. The circuit interrupter of claim 1, wherein
   the light sensitive device is a light sensitive resistor, a resistance of the light sensitive resistor being increased when the light emitting device is turned off due to function failure of the circuit interrupter.

5. The circuit interrupter of claim 4, wherein
   the visual indicator of the end life indicating circuit is turned on when the resistance of the light sensitive resistor increases.

6. The circuit interrupter of claim 1, wherein
   the light sensitive device is a phototransistor, the phototransistor being turned off when the light emitting device is turned off due to function failure of the circuit interrupter.

7. The circuit interrupter of claim 6, wherein
the visual indicator of the end life indicating circuit is turned on when the phototransistor is turned off.

8. The circuit interrupter of claim 1, wherein the end life indicating circuit further comprises a visual indicator switch to control the visual indicator in response to a signal received from the light sensitive device.

9. The circuit interrupter of claim 8, wherein
the light sensitive device is a light sensitive resistor and the visual indicator switch turns on the visual indicator when the resistance of the light sensitive resistor increases.

10. The circuit interrupter of claim 1, wherein
a failure of the control circuit blows the fuse and then turns off the light emitting device.

11. The circuit interrupter of claim 1, wherein
the end life indicating circuit further comprises a first switch and a second switch, the first switch being turned off and the second switch being turned on so that the visual indicator is turned on to indicate the circuit interrupter reaches the end of its life.

12. The circuit interrupter of claim 11, wherein
the first switch includes a second silicon controlled rectifier and the second switch includes an NPN transistor, a fifth resistor, a sixth resistor and a seventh resistor,
wherein first ends of the fifth resistor and the sixth resistor are connected to a line side of the power supply through the seventh resistor; a second end of the fifth resistor is connected to a collector of the NPN transistor; a second end of the sixth resistor is connected to a base of the NPN transistor and an anode of the second silicon controlled rectifier; an emitter of the NPN transistor is connected to an anode of the second light emitting diode; a cathode of the second light emitting diode is connected to a cathode of the second silicon controlled rectifier and a neutral side of the power supply; and a gate of the second silicon controlled rectifier is connected to the light sensitive device.

13. A circuit interrupter comprising:
a control circuit to activate an electromagnetic unit upon detecting a predetermined condition;
a fuse coupled between the control circuit and a power supply;
an end life sensing circuit coupled to the control circuit, the end life sensing circuit including a light emitting device and a light sensitive device controlled by the light emitting device;
an end life indicating circuit coupled to the end life sensing circuit and the power supply, the end life indicating circuit including a visual indicator to indicate a failure of the circuit interrupter; wherein
the control circuit further comprises a rectification circuit, a flux sensing circuit, a control chip and a trip circuit having the electromagnetic unit,
wherein the rectification circuit supplies a direct current to the control chip and the trip circuit; the flux sensing circuit provides a signal to the control chip upon detecting the predetermined condition; and the control chip provides a signal to activate the electromagnetic unit.

14. The circuit interrupter of claim 13, wherein
the rectification circuit further comprises a bridge rectifier, a first resistor and a first capacitor,
wherein the bridge rectifier is coupled to the power supply through the fuse to receive an alternating current and to output a direct current; an output end of the bridge rectifier is connected to a first end of the first resistor; a second end of the first resistor is connected to a positive end of the first capacitor, the control chip, the trip circuit and the end life sensing circuit; and the negative end of the first capacitor is grounded.

15. The circuit interrupter of claim 13, wherein
the trip circuit further comprises a trip switch, a first diode and a second resistor,
wherein a first end of the electromagnetic unit is connected to the power supply through the fuse; a second end of the electromagnetic unit is connected to an anode of the first diode; a cathode of the first diode is connected to a first end of the trip switch; a second end of the trip switch is connected to a ground; a third end of the trip switch is connected to the control chip and a first end of the second resistor; and a second end of the second resistor is connected to the rectification circuit and the end Life sensing circuit.

16. The circuit interrupter of claim 15, wherein
the trip circuit further comprises a second capacitor, a third capacitor, a third resistor and a temperature dependent resistor,
wherein a positive end of the second capacitor is connected to the control chip and the third end of the trip switch; a negative end of the second capacitor is connected to a ground; a first end of the third resistor is connected to the cathode of the first diode and the first end of the trip switch; a second end of the third resistor is connected to a first end of the third capacitor; a second end of the third capacitor is connected to a ground; a first end of the temperature dependent resistor is connected to the third end of the trip switch; and a second end of the temperature dependent resistor is connected to the first end of the second resistor.

17. The circuit interrupter of claim 15, wherein
the trip switch is a trip transistor,
wherein the first end of the trip switch is a collector of the trip transistor; the second end of the trip switch is an emitter of the trip transistor; and the third end of the trip switch is a base of the trip transistor.

18. The circuit interrupter of claim 15, wherein the trip switch is a first silicon controlled rectifier,
wherein the first end of the trip switch is an anode of the first silicon controlled rectifier; the second end of the trip switch is a cathode of the first silicon controlled rectifier; and the third end of the trip switch is a gate of the first silicon controlled rectifier.

19. The circuit interrupter of claim 15, wherein
a first end of the light emitting device is connected to the rectification circuit; a second end of the light emitting device is connected to the cathode of the first diode and the first end of the trip switch; a first end of the light sensitive device is connected to the rectification circuit; and a second end of the light sensitive device is connected to the end life indicating circuit.

20. The circuit interrupter of claim 19, wherein
the light emitting device is a first light emitting diode and the light sensitive device is a light sensitive resistor,
wherein the first end of the light emitting device is an anode of the first light emitting diode and the second end of the light emitting device is a cathode of the first light emitting diode.

21. The circuit interrupter of claim 19, wherein
the light emitting device is a first light emitting diode and the light sensitive device is a phototransistor,
wherein the first end of the light emitting device is an anode of the first light emitting diode; the second end of the light emitting device is a cathode of the first light emitting diode; the first end of the light sensitive device is a collector of the phototransistor; and the second end of the light sensitive device is an emitter of the phototransistor.

22. The circuit interrupter of claim 19, wherein
the light emitting device is a first light emitting diode, the first end of the light emitting device being an anode of the first light emitting diode and the second end of the light emitting device being a cathode of the first light emitting diode, and
the end life sensing circuit further comprises a second diode, a fourth capacitor and a fourth resistor,
wherein the anode of the first light emitting diode is connected to a cathode of the second diode and a first end of the fourth capacitor; a second end of the fourth capacitor is connected to a first end of the fourth resistor; a second end of the fourth resistor is connected to the rectification circuit; and an anode of the second diode is connected to the cathode of the first light emitting diode.

23. A circuit interrupter comprising:
a control circuit to activate an electromagnetic unit upon detecting a predetermined condition;
a fuse coupled between the control circuit and a power supply; and
an end life sensing and indicating circuit coupled to the control circuit, the end life sensing and indicating circuit including a light emitting device,
wherein the light emitting device is turned off to indicate a failure of the control circuit.

24. The circuit interrupter of claim 23, wherein the light emitting device is a first light emitting diode.

25. The circuit interrupter of claim 24, wherein the light emitting device is a green color light emitting diode.

26. The circuit interrupter of claim 23, wherein
a failure of the control circuit blows the fuse and then turns off the light emitting device.

27. A circuit interrupter comprising:
a control circuit to activate an electromagnetic unit upon detecting a predetermined condition;
a fuse coupled between the control circuit and a power supply; and
an end life sensing and indicating circuit coupled to the control circuit, the end life sensing and indicating circuit including a light emitting device,
wherein the light emitting device is turned off to indicate a failure of the control circuit; wherein
the control circuit further comprises a rectification circuit, a flux sensing circuit, a control chip and a trip circuit having the electromagnetic unit,
wherein the rectification circuit supplies a direct current to the control chip and the trip circuit; the flux sensing circuit provides a signal to the control chip upon detecting the predetermined condition; and the control chip provides a signal to activate the electromagnetic unit.

28. The circuit interrupter of claim 27, wherein
the rectification circuit further comprises a bridge rectifier, a first resistor and a first capacitor,
wherein the bridge rectifier is coupled to the power supply through the fuse to receive an alternating current and to output a direct current; an output end of the bridge rectifier is connected to a first end of the first resistor; a second end of the first resistor is connected to a positive end of the first capacitor, the control chip, the trip circuit and the end life sensing and indicating circuit; and the negative end of the first capacitor is grounded.

29. The circuit interrupter of claim 27, wherein
the trip circuit further comprises a trip switch, a first diode and a second resistor,
wherein a first end of the electromagnetic unit is connected to the power supply through the fuse; a second end of the electromagnetic unit is connected to an anode of the first diode; a cathode of the first diode is connected to a first end of the trip switch; a second end of the trip switch is connected to a ground; a third end of the trip switch is connected to the control chip and a first end of the second resistor; and a second end of the second resistor is connected to the rectification circuit and the end life sensing and indicating circuit.

30. The circuit interrupter of claim 29, wherein
the trip circuit further comprises a second capacitor, a third capacitor, a third resistor and a temperature dependent resistor,
wherein a positive end of the second capacitor is connected to the control chip and the third end of the trip switch; a negative end of the second capacitor is connected to a ground; a first end of the third resistor is connected to the cathode of the first diode and the first end of the trip switch; a second end of the third resistor is connected to a first end of the third capacitor; a second end of the third capacitor is connected to a ground; a first end of the temperature dependent resistor is connected to the third end of the trip switch; and a second end of the temperature dependent resistor is connected to the first end of the second resistor.

31. The circuit interrupter of claim 29, wherein
the trip switch is a trip transistor,
wherein the first end of the trip switch is a collector of the trip transistor; the second end of the trip switch is an emitter of the trip transistor; and the third end of the trip switch is a base of the trip transistor.

32. The circuit interrupter of claim 29, wherein
the trip switch is a first silicon controlled rectifier,
wherein the first end of the trip switch is an anode of the first silicon controlled rectifier; the second end of the trip switch is a cathode of the first silicon controlled rectifier; and the third end of the trip switch is a gate of the first silicon controlled rectifier.

33. The circuit interrupter of claim 29, wherein
a first end of the light emitting device is connected to the rectification circuit, and a second end of the light emitting device is connected to the cathode of the first diode and the first end of the trip switch.

34. The circuit interrupter of claim 33, wherein
the light emitting device is a first light emitting diode,
wherein the first end of the light emitting device is an anode of the light emitting diode and the second end of the light emitting device is a cathode of the light emitting diode.

35. The circuit interrupter of claim 34, wherein
the end life sensing and indicating circuit further comprises a second diode, a fourth capacitor and a fourth resistor,
wherein the anode of the first light emitting diode is connected to a cathode of the second diode and a first end of the fourth capacitor; a second end of the fourth capacitor is connected to a first end of the fourth resistor; a second end of the fourth resistor is connected to the rectification circuit; and an anode of the second diode is connected to the cathode of the first light emitting diode.

* * * * *